(12) United States Patent
Fischer

(10) Patent No.: US 6,430,590 B1
(45) Date of Patent: Aug. 6, 2002

(54) METHOD AND APPARATUS FOR PROCESSING EXECUTABLE PROGRAM MODULES HAVING MULTIPLE DEPENDENCIES

(75) Inventor: Stephen E. Fischer, Town of Wappingers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/239,943

(22) Filed: Jan. 29, 1999

(51) Int. Cl.[7] .................................................. G06F 9/00
(52) U.S. Cl. ..................... 709/100; 709/102; 709/106; 714/2; 714/20; 714/48; 714/45; 717/114; 717/141
(58) Field of Search ........................ 709/100; 714/2, 714/20, 32, 35, 38, 45; 717/114, 141, 158; 712/201, 214, 233, 236, 237

(56) References Cited

U.S. PATENT DOCUMENTS

| | | | | |
|---|---|---|---|---|
| 5,331,579 A | * | 7/1994 | Maguire, Jr. et al. ........... 703/2 |
| 5,826,078 A | * | 10/1998 | Funaki ....................... 709/100 |
| 5,889,999 A | * | 3/1999 | Breterniz, Jr. et al. ...... 717/158 |
| 6,026,365 A | * | 2/2000 | Hayashi ........................ 705/9 |
| 6,230,200 B1 | * | 5/2001 | Forecast et al. ............ 709/226 |

\* cited by examiner

*Primary Examiner*—Majid Banankhah
(74) *Attorney, Agent, or Firm*—Connolly Bove Lodge & Hutz LLP

(57) ABSTRACT

A computer readable storage medium for executing a simulation process representing a collection of semiconductor devices and tests for the devices. The simulation process constitutes a batch job of a plurality of execution modules representing nodes of a directed acyclic graph. Each of the nodes contains a directory identifying any parent modules which have to be executed prior to executing the module, and identifying any child execution modules which are to be executed subsequent to executing the module. The directory also includes a status file indicating the state of execution of the module containing the directory. A supervisory processor performs a job farming operation on each of the execution modules in a distributed processing system. The execution modules are processed in an order defined by the identity of any parent and child modules referenced in the directories. At the completion of execution of a module, the status file of the directory is changed to indicate that the module has been executed.

11 Claims, 4 Drawing Sheets

METHOD AND APPARATUS FOR PROCESSING EXECUTABLE PROGRAM MODULES HAVING MULTIPLE DEPENDENCIES

BACKGROUND OF THE INVENTION

The present invention relates to the semiconductor device simulation art. Specifically, a computer implemented method is described which is capable of automatically executing program modules having multiple execution prerequisites in a semiconductor device simulation.

The design of integrated circuits has incorporated the use of a virtual factory for simulating semiconductor device designs before any actual circuits are produced in silicon. The manufacturing process for creating circuit devices in silicon requires numerous processing steps to be taken to create a device in silicon. The virtual factory permits simulation of the devices reducing the necessity to use the actual manufacturing facilities during the design phase. Device designers can simulate components in a computer simulation facility, and conduct tests on the device to verify its performance. Thus, the designer can experiment with each device using simulation equipment which is considerably less costly than manufacturing a device using the traditional wafer processing facilities, and results are available in a few days, rather than the weeks required to form a device in silicon.

Designers have made use of these simulation systems to model a collection of processes for manufacturing devices which tend to be performance related. For instance, a single process recipe for forming a device in silicon may be altered in several ways so that a collection of devices which are related, but distinct, are modeled and tested.

The simulation includes a library of process recipes, which are stored and reused, containing executable process commands with parameters which describe the manufacturing process being simulated. Additionally, a test may be invoked for a device created with the simulated process. The entire process of creating a simulated semiconductor process to derive a simulated semiconductor device, and to test the device, creates a simulation flow. The simulation flow comprises executable modules which when executed provide an input for the simulator, which when executed by the simulator, provides an output file, indicating the performance of the device for a selected test.

The execution of the simulation has historically been done by arranging the execution modules in a simulation flow to avoid having multiple execution prerequisites for any given module. Thus, the simulation flow typically resembles a tree with leaves, so that each module execution has exactly zero or one prerequisite, permitting the use of a simplified job scheduling algorithm in a multiprocessor environment, without concern for multiple prerequisites.

However, it is advantageous in certain simulations to represent a simulation flow as executable modules in a directed acyclical graph which is a more general structure than the tree. In this well known representation, modules may have multiple prerequisites constituting an input for a module. For instance, one module may require the execution of two or more parent modules to produce the data necessary for its own execution. The prior art simulation frameworks are not known to be able to process a directed acyclic sequence graph comprising such executable modules. The present invention is directed to an automated system and method for efficient execution of modules having an execution flow represented by the more general directed acyclic graph.

SUMMARY OF THE INVENTION

The present invention provides a method to generate a simulation process representing a collection of simulated semiconductor devices and tests for the simulated devices. The semiconductor processes and tests for the simulated devices are represented by a plurality of execution modules which are automatically executed in an optimum sequence represented by a directed acyclic graph describing the module interdependencies.

The method in accordance with the invention is preferably executed in a multiprocessor system where each execution module is farmed out by a supervisory processor to an available processor for execution. The execution module is implemented as a directory containing a file of pointers to identify any parent module which must be executed first, and may include pointers to any child modules which are subsequently executed. The directory also includes a status file to indicate the execution state of each module. During a simulation of the collection of semiconductor processes and testing of the simulated devices, a supervisory processor of the multiprocessor system initiates execution of the modules in an order defined by the identity of any parent pointers contained within the directory. Once an execution module has completed execution, a command within the execution module changes the status file of the directory to indicate the execution has completed.

The file of pointers for each execution module permits the supervisory processor to maintain a list of those modules which are parent modules, and execution for any such child module is delayed until the parent module is executed. When the module is ready for execution, the supervisory processor provides job farming of the execution module to an available processor.

The invention may advantageously be stored as a set of instructions on a computer readable medium which is used to program the supervisory processor to carry out the inventive method.

DETAILED DESCRIPTION OF THE PREFERRED EMBODIMENT

Figure 1:
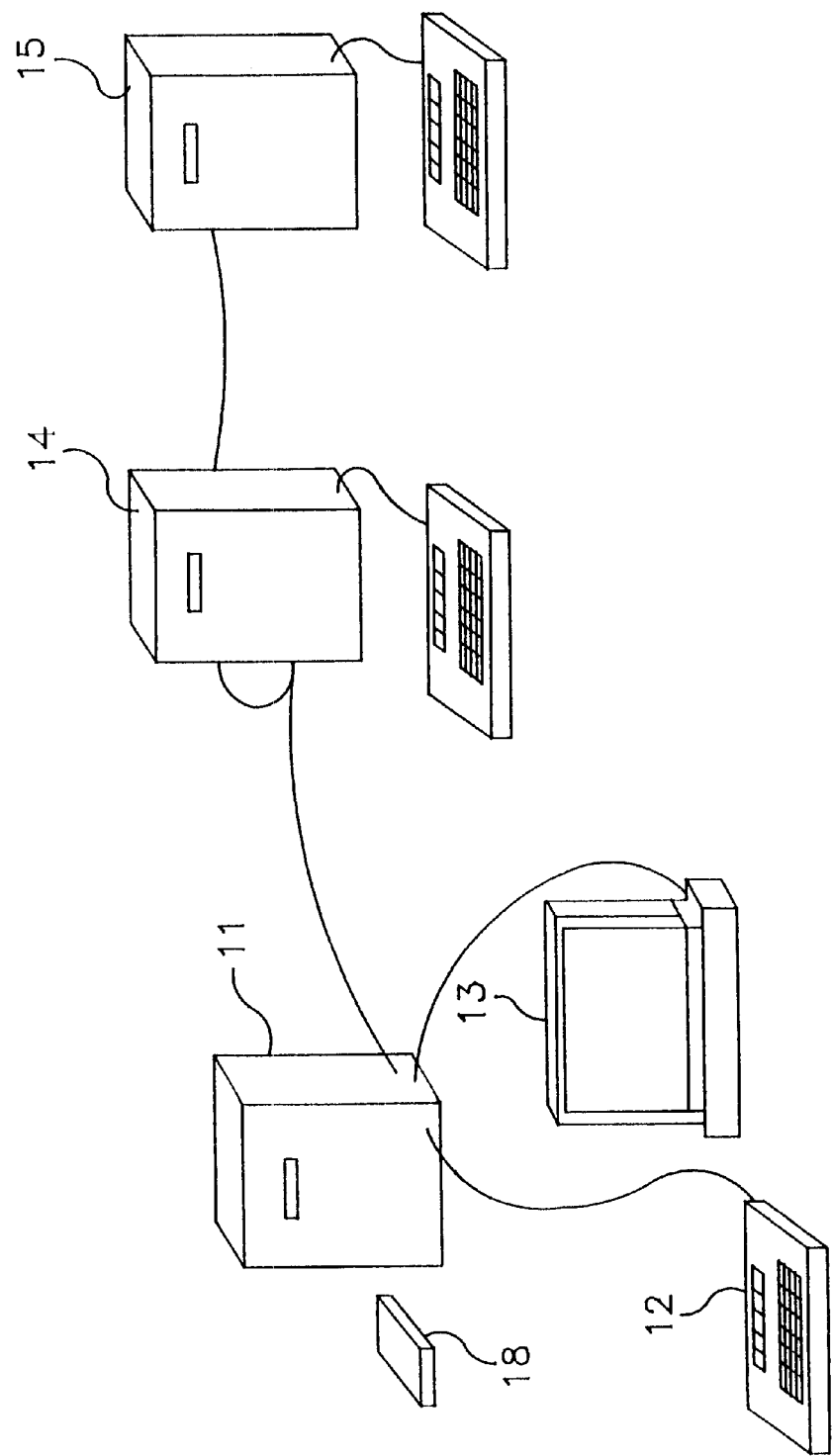
FIG. 1 shows a distributed processing system for executing semiconductor simulation flows.

FIG. 1 illustrates the multiple processing system which may be used to implement any of the well known semiconductor device simulation processes. For instance, the TCAD (Technology Computer Assisted Design) system runs on a supervisory processor 10, which is capable of farming out various execution modules, to be executed in parallel for processing efficiency. The simulator includes a library of process recipes, as well as tests which may be accessed by the user using keyboard 12 and display 13 for measuring the performance of the simulated devices. The process recipes are stored in a computer file as a beginning template which may be accessed and used to initiate a simulation. The process recipe, in turn, when executed, creates a simulated device in accordance with a semiconductor process. The process recipe includes a command file identifying each of a plurality of steps for creating the device in silicon.

Figure 2:
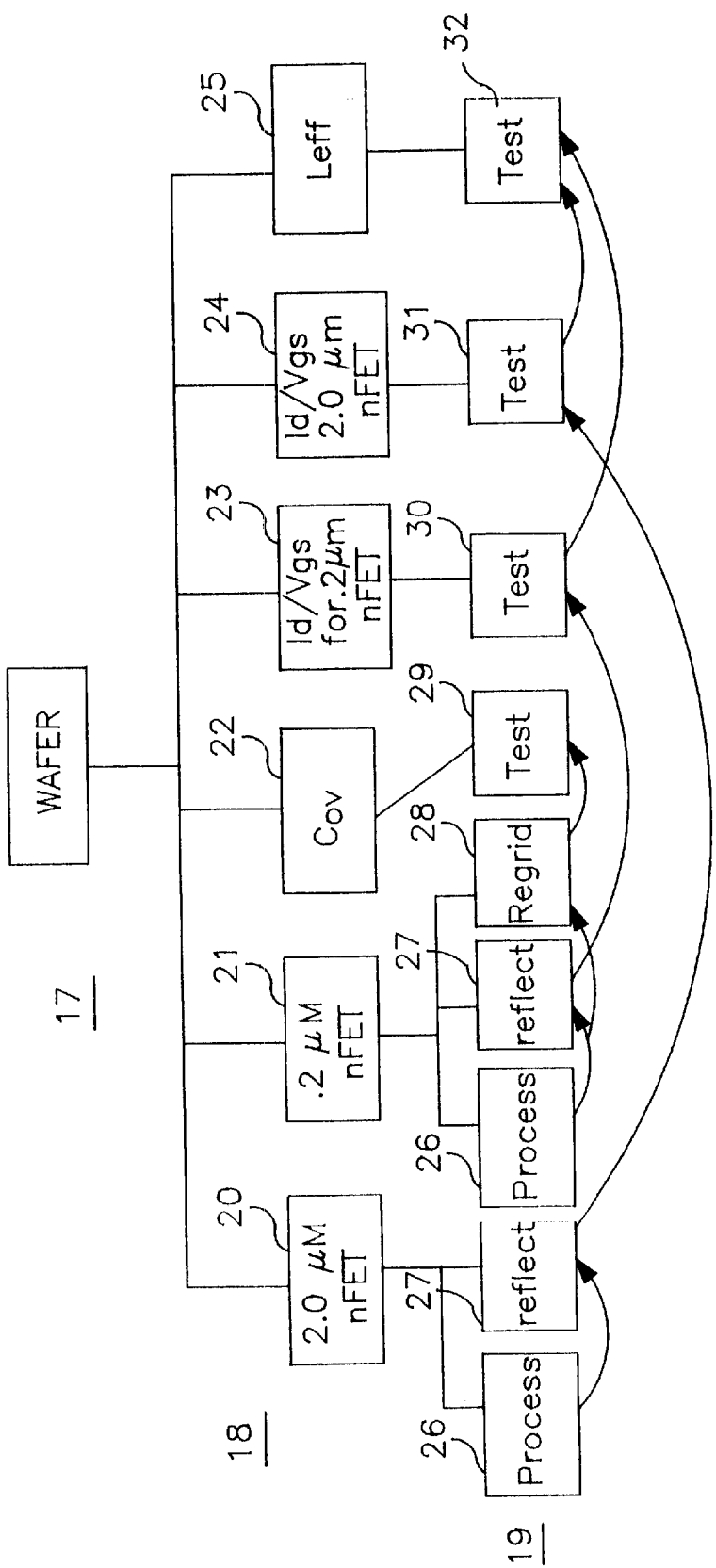
FIG. 2 is a results directory structure illustrating a simulation flow.

FIG. 2 illustrates a results directory, depicting experiments to be run on a collection of simulated semiconductor devices. The results directory has three levels: the wafer level 17, the item/test level 18 which defines the simulated devices and tests for the devices for evaluating device performance, and an execution module level 19.

The execution module level 19 illustrates the individual execution modules which are processed in the multiprocessor computer system to derive the performance information for the devices. In the scenario represented by FIG. 2, two nFETs are simulated, the first 20 having a channel length of 2.0 microns, and the second nFET 21 having a channel length of 0.2 microns. The remaining items in the item and test level 18 are tests to be carried out for the simulated devices 20 and 21.

The first of these tests 22 represents a measure of overlap capacitance ($C_{ov}$) for device 21. Additional tests 23 and 24 represent the Id/vgs function to be carried out on the simulated devices. Further, an effective channel length is set forth as a test item 25.

The execution sequence of the modules for deriving the items and tests of the level 18 are shown in level 19. Each item, or test, requires a process script 26, 27 or test script 29–32. Additionally, there are shown reflect and regrid modules 27 and 28, which as is known in TCAD experiments, which may be needed to prepare the device for simulated testing. The execution modules 19 represent a directed acyclic graph, which produces multiple execution prerequisites for the test module 32.

Figures 3, 4:
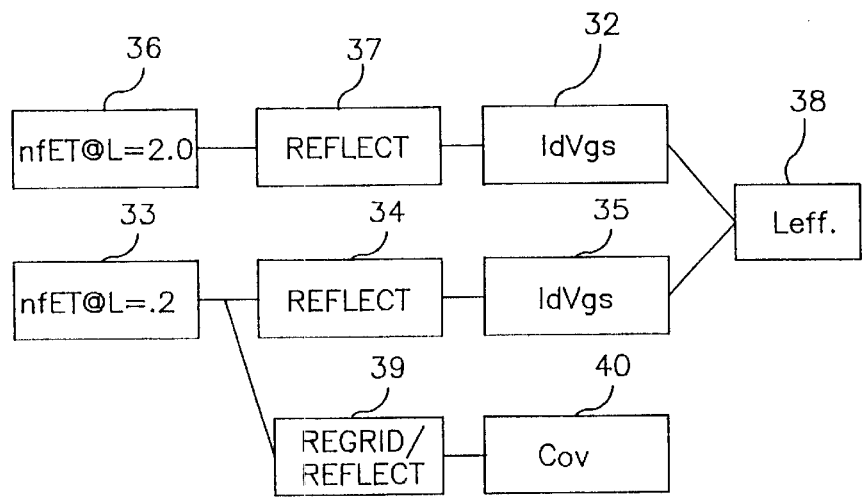
FIG. 3 represents a directed acyclic graph executed in accordance with one embodiment of the invention.
FIG. 4 illustrates the directory of each execution module.

The actual execution flow of the simulation modules to obtain the desired performance characteristics is shown more particularly in FIG. 3 as a directed acyclic graph where the execution modules are represented by a plurality of nodes. In the example of FIG. 3, the processes for simulating a pair of simulated devices comprising an nFET having a channel length of 2 microns, and an nFET having a channel length of 0.2 microns are shown as nodes 36 and 33 of the directed acyclic graph. The input template recipe specifies the process steps for one half of the simulated device as is known in TCAD simulation systems. A regrid/reflect process represented by nodes 34 and 37 is executed to provide a full length nFET device from the template recipe under control of instructions on computer readable media 18. The simulated devices are tested to determine the drain current, Id, versus gate source voltage, Vgs, function by executing modules 32 and 35. Node 35 extracts an effective channel length (Leff) based on the Id vs Vgs simulation results for both nFETs. As is known in the semiconductor simulation art, the effective nFET length for a simulated device can be obtained using the drain current, Id, versus gate source voltage vgs, functions produced from simulating a long channel nFET and short channel nFET.

The directed acyclic graph of FIG. 3 represents an execution sequence of modules in which one of the modules 38 has multiple prerequisites (parents) so that the graph cannot be represented as a tree structure. The effective channel length of 38 cannot be obtained until the prior nodes represented by 32 and 35 have been executed.

As an additional simulated test scenario, a value of an overlap capacitance $C_{ov}$ parameter is determined in step 40 for the nFET having a length of 0.2 microns once the 0.2 micron nFET is regrid by executing module 39.

The method in accordance with the present invention creates from a set of instructions on a computer readable media 18 an execution module in the form of a directory, containing as a minimum the information shown in FIG. 4. Referring now to FIG. 4, the directory for an execution module includes a file with a pointer to any parent execution module which must be executed before the child execution module may be executed. Additional pointers to child execution modules may be provided so that the supervisory processor 10 will know which execution modules are to be subsequently executed to improve program efficiency. A script file containing the computer executable recipe for carrying out any of the module functions is included in the directory. In the case of execution modules 36 and 33, these include the process recipe from the catalog contained within the simulation processing system, as modified by the user at the time the collection of simulation flow is developed. The directory includes an execution status data in one of its files to identify the execution module as either being "waiting for execution," "currently running in execution," and "complete in execution." In this way, it is possible to apportion the various nodes for execution in an order that does not violate the parent-child relationship.

Figure 5:
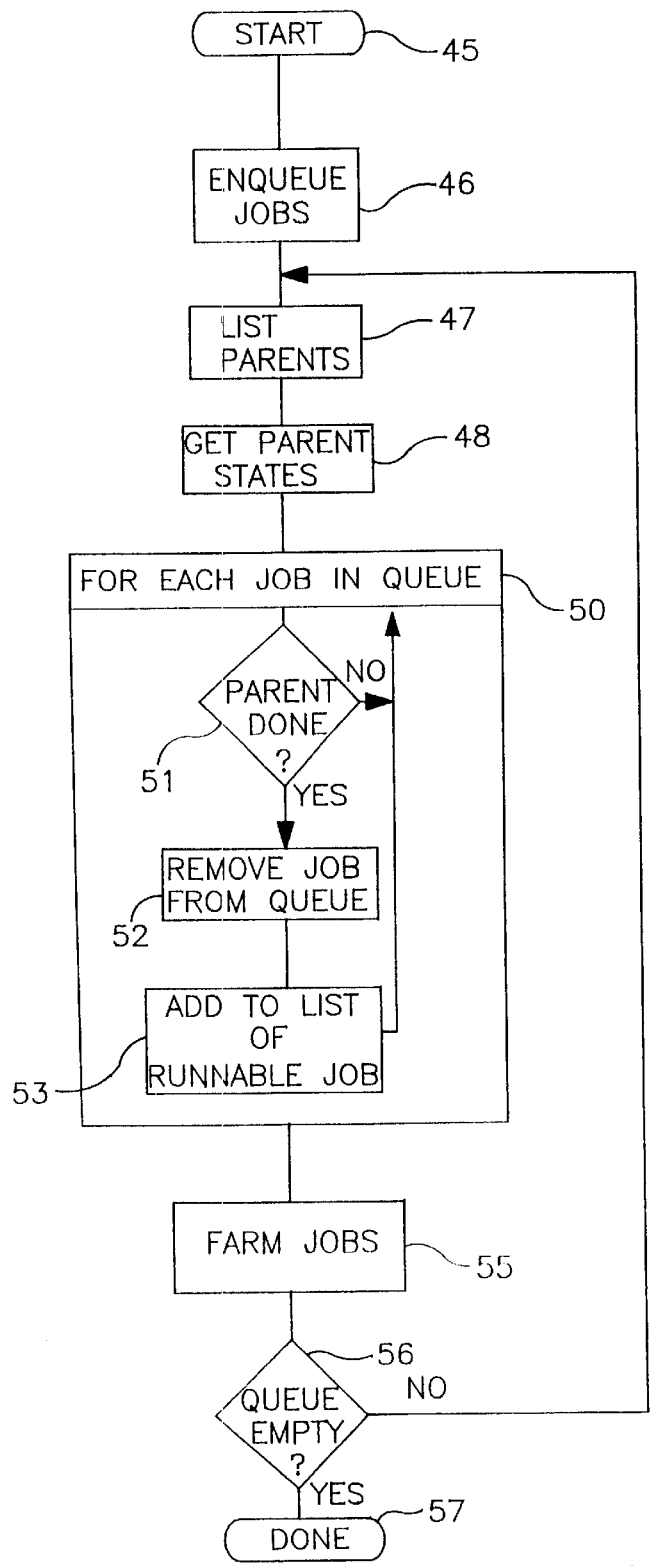
FIG. 5 illustrates the supervisory processor execution flow to perform the job farming of modules to be executed.

The directed acyclic graph, representing the simulation processes to be executed, may then be processed by the supervisory processor 10 in accordance with further instructions stored on media 18. Referring now to FIG. 5, a flow chart illustrates the execution sequence of supervisory processor 10. When the user enters a run mode in step 45, the execution module jobs are queued in a job framework queue in step 46. Each of the jobs are references by a job ID number, which may conveniently represent the path to the execution module of each execution module. The system obtains a list of modules which are parent modules in step 47 by checking the directories of each execution module for a pointer indicating that one or more parent module exists. A compilation is made in step 48 of the execution status of the parent modules as reflected in the execution status file for each execution module.

For each job that has been stored in the framework queue, a loop is entered 50 which determines in step 51 whether parent execution modules for each module has been executed. When the parent execution modules have been executed, the child execution module is removed from the job queue in step 52 and added to a list of runable jobs in step 53. The list of runable jobs identifies those execution modules which may now be run.

The remaining jobs in the runable jobs list are executed in step 55, by farming out the remaining jobs to any available processor in the multiprocessor system. This continues until the runable jobs list is empty at which time the execution ends in step 57.

The directed acyclic graph node structure is inherently persistent, as it is stored in the file system of the supervisory processor 10. In the event of any multiprocessor interruption, the system may begin again from its interruption point, as the execution states of the execution modules will remain in their pre-interrupted state. Each module is self-contained with script as well as execution sequence information to permit efficient processing. Thus, the multiprocessor environment is very efficient, and execution of the processes will not interfere with any individual process being executed on another processor.

The self-contained nature of the executable modules supports multi-user use. Multiple users may execute and monitor jobs in a single job graph simultaneously without interfering with each other since state information is publicly available in the file system.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A computer-readable storage medium storing computer-executable instructions for implementing method steps for controlling the processing order of executable program modules in a computer system having multiple interdependent executable program modules, said method steps comprising:

creating for each executable program module, a list of parent modules for said executable program module, and a status file for representing whether said executable program module is awaiting execution or has completed execution;

arranging said modules as nodes in an execution sequence defined by a directed acyclic graph;

traversing the directed acyclic graph to begin execution of all executable program modules without parent modules;

periodically checking the parent list of each node to determine whether all parent modules have completed execution;

updating the associated status file when a module has completed execution; and beginning the execution of modules whose parent modules have completed execution, and updating the associated status file to indicate the module is currently executing.

2. The computer-readable storage medium of claim 1, wherein access to status information in a process flow of executable program modules is global in a multiprocessor system, allowing simultaneous use of said multiple computer systems to process a process flow.

3. The computer readable storage medium of claim 1 wherein each of said execution modules contain a script identifying the job to be executed by said computer system.

4. The computer readable storage medium of claim 3 wherein each of said execution modules' list of parent modules and execution code are contained in a directory.

5. The computer readable storage medium of claim 1 wherein said method further includes the updating of said status file when execution of said module begins.

6. A method for executing a simulation process representing a collection of semiconductor devices and tests of said devices defined by a batch job of a plurality of execution modules representing nodes of an acyclic graph to be executed, comprising:

creating a directory of pointers for each module identifying any parent modules which have to be executed prior to executing the module containing said directory, said directory also including a file which identifies the execution status of the module containing said directory;

job farming each of said execution modules for execution in a distributed processing system in an order defined by the identity of any parent; and changing the status file of a directory of a module when said execution of said module is completed.

7. The method for executing a semiconductor simulation process according to claim 6 wherein said job farming is carried out by a supervisory computer of said distributed processing system in an order which executes said modules having no parent execution modules prior to executing the remaining execution modules.

8. The method for executing a semiconductor simulation process according to claim 7 wherein said supervisory computer controls execution of said remaining execution modules by locating child modules having a status file which remains in the unexecuted state from a parent execution module which has completed execution.

9. The method for executing a semiconductor simulation process according to claim 6 wherein each directory contains a script defining the job to be executed for that execution module.

10. The method for executing a semiconductor simulation process according to claim 7 wherein said supervisory computer periodically checks the status bit of each directory of a module, and the state of the status file of any parent module, before assigning said module for execution.

11. The method for executing a semiconductor simulation process according to claim 10 wherein said supervisory computer after checking said status bits, starts a subprocess to execute said execution module assigned for execution and to update said module status field to a running status.

* * * * *